(12) United States Patent
Barry et al.

(10) Patent No.: US 6,828,212 B2
(45) Date of Patent: Dec. 7, 2004

(54) METHOD OF FORMING SHALLOW TRENCH ISOLATION STRUCTURE IN A SEMICONDUCTOR DEVICE

(75) Inventors: Timothy M. Barry, Colleyville, TX (US); Nicolas Degors, Trets (FR); Donald A. Erickson, Dallas, TX (US); Amit S. Kelkar, Irving, TX (US); Bradley J. Larsen, Woodland Park, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/278,294

(22) Filed: Oct. 22, 2002

(65) Prior Publication Data

US 2004/0087104 A1 May 6, 2004

(51) Int. Cl.[7] .............................................. H01L 21/762
(52) U.S. Cl. ....................................... 438/424; 438/435
(58) Field of Search ................................ 438/424–438, 438/692, FOR 229; 148/DIG. 50

(56) References Cited

U.S. PATENT DOCUMENTS

| | | | | |
|---|---|---|---|---|
| 5,578,518 A | * | 11/1996 | Koike et al. | 438/424 |
| 5,940,716 A | * | 8/1999 | Jin et al. | 438/424 |
| 5,994,201 A | * | 11/1999 | Lee | 438/427 |
| 6,074,931 A | * | 6/2000 | Chang et al. | 438/424 |
| 6,159,823 A | * | 12/2000 | Song et al. | 438/437 |
| 6,165,854 A | * | 12/2000 | Wu | 438/296 |
| 6,177,333 B1 | | 1/2001 | Rhodes | 438/433 |
| 6,187,649 B1 | * | 2/2001 | Gau | 438/424 |
| 6,221,736 B1 | | 4/2001 | Gau | 438/435 |
| 6,232,185 B1 | | 5/2001 | Wang | 438/266 |
| 6,274,434 B1 | | 8/2001 | Koido et al. | 438/266 |
| 6,277,710 B1 | * | 8/2001 | Kim et al. | 438/431 |
| 6,287,930 B1 | | 9/2001 | Park | 438/369 |
| 6,291,312 B1 | * | 9/2001 | Chan et al. | 438/444 |
| 6,376,877 B1 | | 4/2002 | Yu et al. | 257/317 |
| 6,555,442 B1 | * | 4/2003 | Pai et al. | 438/424 |
| 2002/0068415 A1 | * | 6/2002 | Tseng et al. | 438/435 |
| 2002/0072197 A1 | * | 6/2002 | Kang et al. | 438/424 |

FOREIGN PATENT DOCUMENTS

JP          10303291 A  * 11/1998  .......... H01L/21/76

* cited by examiner

Primary Examiner—George Fourson
(74) Attorney, Agent, or Firm—Schneck & Schneck; Thomas Schneck

(57) ABSTRACT

A method for fabricating a shallow trench isolation structure is described, in which a bottom pad oxide layer, a middle silicon nitride layer, a middle oxide layer and a top silicon nitride layer are sequentially formed on a silicon substrate. Photolithographic masking and anisotropic etching are then conducted to form a trench in the substrate. An oxide material is then deposited on top of the top silicon nitride layer, filling up the trenches at the same time. A chemical mechanical polishing step is then employed to remove the oxide material by using the top silicon nitride layer as a barrier layer. The top silicon nitride layer is then removed, followed by an isotropic etch of the oxide layer below. With the middle nitride layer acting as a natural etch stop, the oxide material is sculpted to a desirable shape. The middle nitride layer and the pad oxide layer are subsequently removed to complete the fabrication of a shallow trench isolation structure.

17 Claims, 4 Drawing Sheets

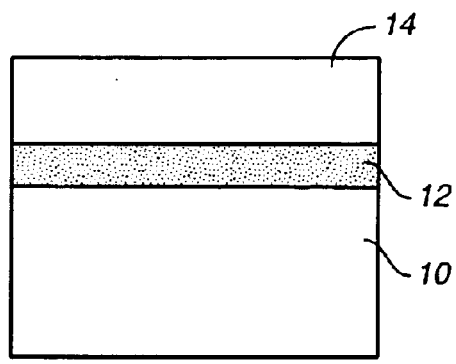
FIG._1A
*(PRIOR ART)*
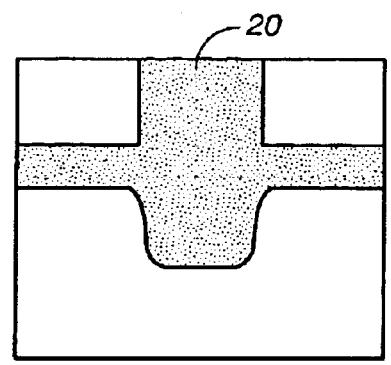
FIG._1D
*(PRIOR ART)*
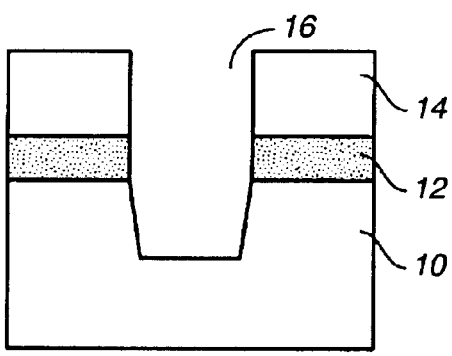
FIG._1B
*(PRIOR ART)*
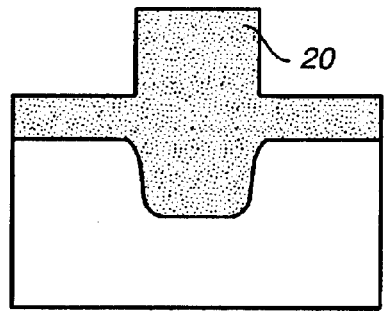
FIG._1E
*(PRIOR ART)*
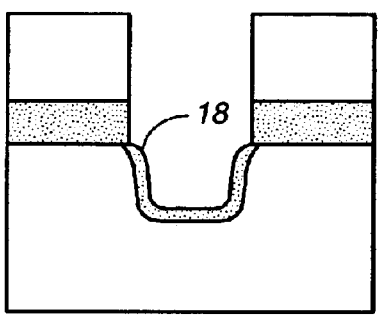
FIG._1C
*(PRIOR ART)*
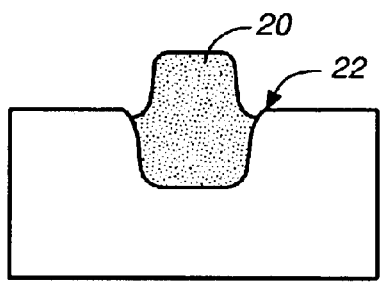
FIG._1F
*(PRIOR ART)*

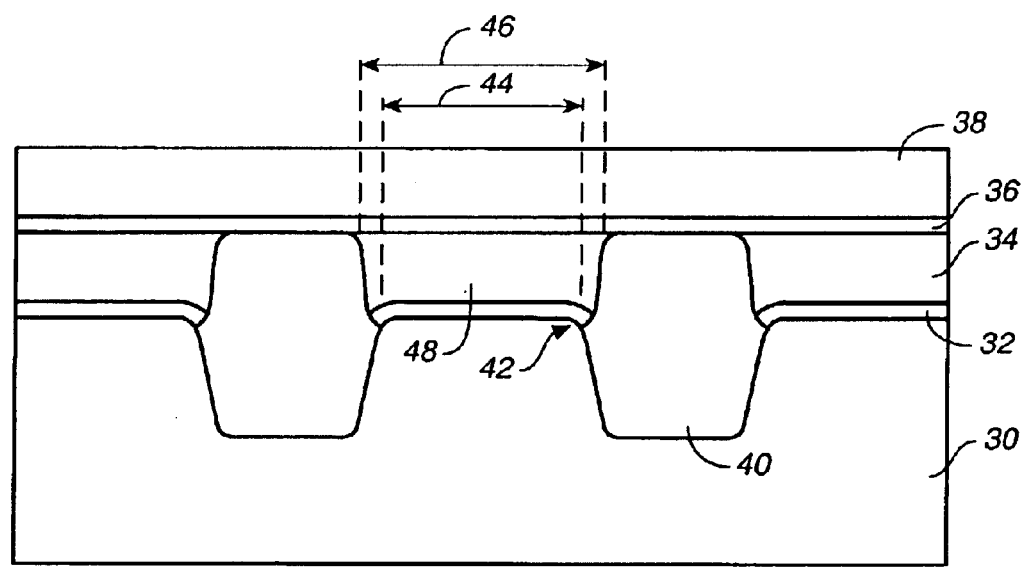
FIG._2 *(PRIOR ART)*
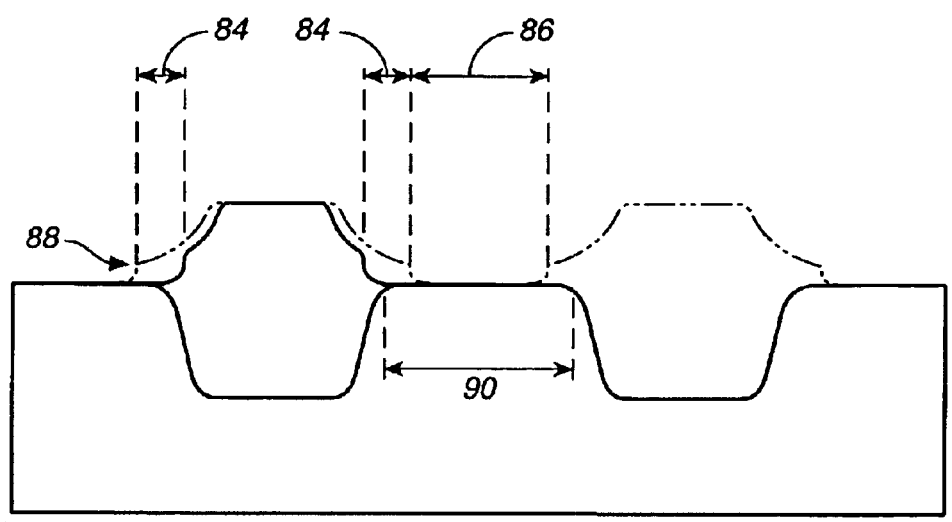
FIG._4

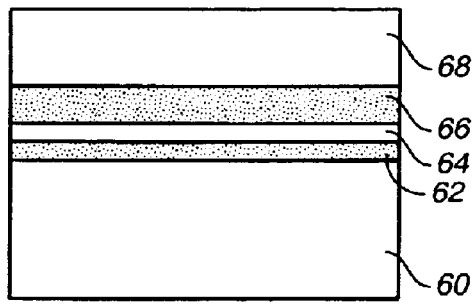
FIG._3A
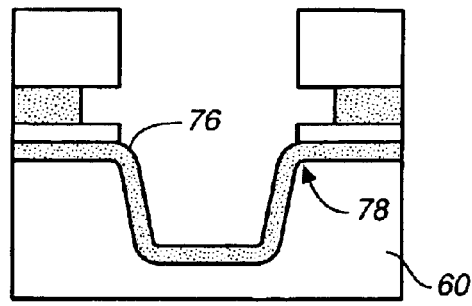
FIG._3D
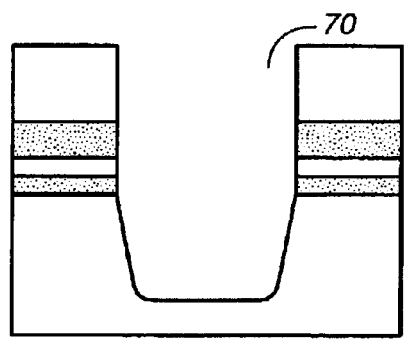
FIG._3B
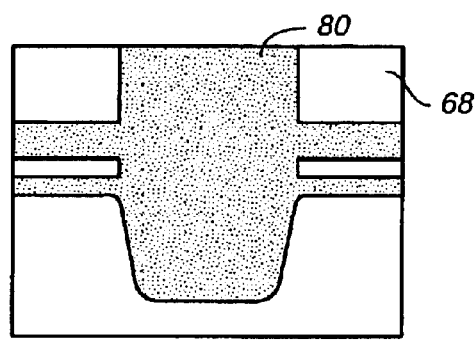
FIG._3E
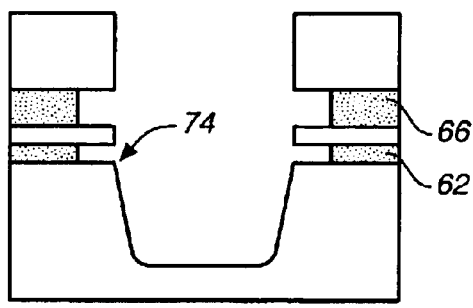
FIG._3C
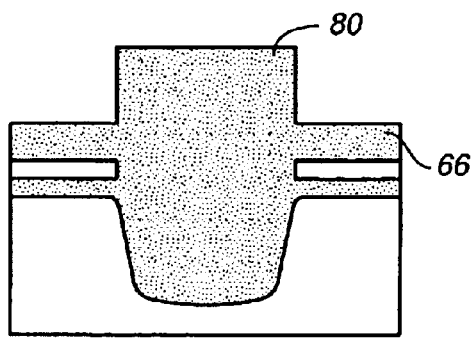
FIG._3F

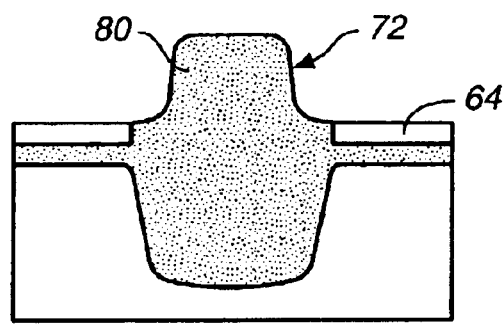
FIG._3G
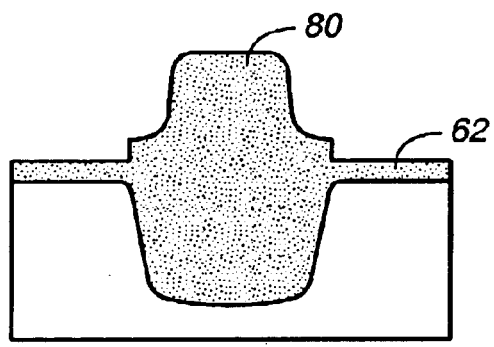
FIG._3H
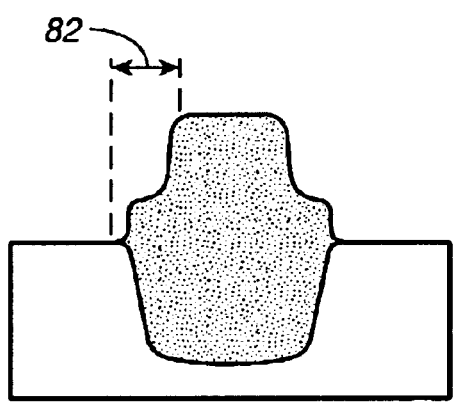
FIG._3I

US 6,828,212 B2

METHOD OF FORMING SHALLOW TRENCH ISOLATION STRUCTURE IN A SEMICONDUCTOR DEVICE

FIELD OF INVENTION

The present invention relates to fabrication methods for integrated semiconductor circuits. More particularly, the present invention relates to fabrication methods for shallow trench isolation structures.

BACKGROUND ART

In the fabrication of densely packaged integrated circuits, fabricating shallow trench isolation (STI) structures around active devices is a very effective way for preventing carriers from penetrating through the substrate to neighboring devices. A common procedure for the formation of STI structures is shown in FIG. 1. In FIG. 1A, a layer of pad oxide 12 and a layer of silicon nitride 14 are sequentially formed on top of a semiconductor substrate 10. In FIG. 1B, a shallow trench 16 is formed by photolithographic masking and anisotropic etching of the covering layers 12 and 14 and the semiconductor substrate 10. In FIG. 1C, a thin liner oxide 18 is formed on the exposed silicon substrate by thermal oxidation. An oxide deposition step that follows fills up the trench 16 with an oxide material, and a chemical mechanical polishing (CMP) step that follows makes possible the structure shown in FIG. 1D. FIG. 1E shows the structure left behind once the silicon nitride layer 14 is removed. A subsequent oxide etch results in the isolation structure shown in FIG. 1F.

Once the isolation structure is completed, semiconductor devices such as EEPROM cells can be built. FIG. 2 shows a partially formed EEPROM cell. A first step in building the EEPROM cell is to form a thin gate oxide layer 32 on a silicon substrate 30. A subsequent CVD deposition of a polysilicon layer 34 forms a floating gate for the EEPROM 48. An oxynitride (ONO) layer 36 and a second polysilicon layer 38, which functions as a control gate, is subsequently formed. As it is well known to those skilled in the art, an EEPROM cell can be programmed or erased more efficiently if its coupling ratio is higher. Coupling ratio is the ratio of a first capacitance (not shown) formed between the control gate 38 and the floating gate 48 and a second capacitance (not shown) formed between the floating gate 48 and the silicon substrate 30. Since the first and second capacitances are connected in series, a higher coupling ratio means that, with all other factors remaining the same, there is a higher voltage drop between floating gate 48 and the substrate 30, making it easier and faster for electrons to tunnel through the gate oxide 32. As a result, programming and erasure of the EEPROM is quicker.

A variety of ways have been developed over the years to improve the coupling ratio of an EEPROM cell. Two obvious approaches to improve the coupling ratio are either by increasing the first capacitance (between the control gate 38 and the floating gate 48) or by decreasing the second capacitance (between the floating gate 48 and the substrate 30). It is equally well understood that the capacitance can be manipulated either through the manipulation of the capacitative surface area or the manipulation of the distance between the capacitative surfaces. One method for increasing the coupling ratio calls for the thickening of the gate oxide layer 32 while simultaneously creating a smaller tunneling region in part of the gate oxide layer to facilitate carrier transfer. Another method calls for the reduction in the area occupied by the gate oxide 32. Yet another method calls for the thinning of the oxynitride layer 36. It would also be desirable to further increase the first capacitance (between the control gate 38 and the floating gate 48) by increasing the surface area 46 occupied the oxynitride layer 36. However, with the existing method of forming the isolation trench structure, as described above and illustrated in FIG. 1, it is impossible to expand the oxynitride area 46 without expanding the gate oxide area 44 at the same time, thereby canceling any advantage of such operation in improving the coupling ratio.

Consequently, it would be desirable to have an isolation trench fabrication scheme that allows for the independent manipulation of the area occupied by the gate oxide layer 32 and the area occupied by the oxynitride layer 36.

Another limitation of the present fabrication method is that the thickness of the gate conductor is constrained by the thickness of the pad oxide layer (12 in FIG. 1). This is because the height of the gate conductor is typically limited by the height of the protruding isolation structure (40 in FIG. 2) and the height of the protruding isolation structure 40 is, in turn, determined by the total height of the silicon nitride layer (14 in FIG. 1) and the pad oxide layer 12. However, since the expansion coefficient of the silicon nitride layer 14 and that of the pad oxide layer 12 are very different, high stress could build up around the interface of the two layers 12 and 14 during subsequent manufacturing steps. Such stress can cause crystal lattice dislocation in the active area of the substrate, leading to current leakage and device failure. As a rule of thumb, in order to prevent excessive stress from building up, the thickness of the nitride layer 14 should be no more than ten times that of the pad oxide layer 12. And since it is generally desirable to have a very thin pad oxide layer 12 so that the final oxide etch could be done quickly and in a controlled manner, the thickness of the nitride layer 14 is limited as well. It would be desirable to have a fabrication method that allows the formation of a taller isolation structure without raising the thickness of the pad oxide layer 12. Yet another issue confronting IC chip manufacturer is the exposure of the sharp substrate corners (22 in FIG. 1F and 42 in FIG. 2) in the active area once the pad oxide layer 12 is etched off. Since stress tend to concentrate at sharp corner of the shallow trench, the exposed sharp corners 42 could cause junction leakage in the finished devices, contributing to device failure. It would be desirable to have a fabrication method for an isolation structure that reduces sharp corner formation and subsequent exposure.

SUMMARY OF INVENTION

To overcome the limitations imposed by the aforementioned fabrication process, the present invention provides a unique four-layer approach for the formation of an isolation trench structure. In a preferred embodiment of the present invention, the isolation trench fabrication process begins with the forming of a multi-layer structure on a silicon substrate, which includes the steps of forming a layer of thin pad oxide, a layer of silicon nitride, a thicker layer of silicon oxide and an even thicker layer of silicon nitride sequentially. Photolithographic masking and anisotropic etching procedures follow to form trenches in the silicon substrate. A silicon oxide material is then deposited to fill up the trenches. The top silicon nitride layer is then etched off, exposing the oxide layer and part of the trench filling oxide that appeared as a protruding structure. Using the remaining nitride layer as a natural etch stop, the exposed oxide is then etched away isotropically. With the nitride layer acting as a natural etch barrier, the etch time can be extended to create a desirable profile on the protruding oxide structure, increasing the coupling ratio through the increase in oxynitride surface area. Once a desirable profile has been achieved on the oxide structure, a nitride etch is performed to eliminate the silicon nitride layer. A short oxide etch is then performed to etch off the remaining thin pad oxide, leaving behind a protruding isolation structure that has a peak area that could be substantially smaller than foot area, thereby enable the making of EEPROM with improved coupling ratio. Furthermore, the constraint on the thickness of the protruding isolation structure is lifted by using the multiple layer structure because the thickness of the top nitride layer is no longer constrained by the need for a thin pad oxide layer.

BRIEF DESCRIPTION OF THE DRAWINGS

FIG. 1, consisting of FIGS. 1A–1F, is a series of cross sectional drawings showing the steps of making a shallow trench isolation structure of the prior art.

FIG. 2 is a cross sectional diagram showing a partially formed non-volatile memory structure based on the isolation structure of the prior art.

FIG. 3 consisting of FIGS. 3A–3I, is a series of cross-sectional drawings showing the steps of making a shallow trench isolation structure according to one embodiment of the present invention.

FIG. 4 is a cross sectional diagram showing the trench isolation structure result from using an alternate embodiment of the present invention.

BEST MODE FOR CARRYING OUT THE INVENTION

Referring to FIG. 3A, the method of forming a shallow trench isolation structure in accordance with the present invention begins with thermal oxidation of a silicon substrate 60 to form a thin pad oxide 62 on top of the silicon substrate 60. A first nitride layer 64, which is typically within a thickness range of 100 Å and 500 Å, is then deposited on top of the pad oxide layer 62, which is typically within a thickness range of 50 Å and 200 Å, followed by a deposition of second silicon oxide layer 66, which is typically within a thickness range of 100 Å and 300 Å, and a second silicon nitride 68 layer, which is typically within a thickness range of 1000 Å and 2000 Å. In a typical process, the silicon nitride layers 64 and 68 and the oxide layer 66 are formed by low pressure chemical vapor deposition (LPCVD). In FIG. 3B, the trench area is first defined using a mask (not shown) formed on top of the second silicon nitride 68 layer and an anisotropic etch is then performed to form a shallow trench 70. FIG. 3C shows the pulling back of the oxide layers 66 and 62 by exposing the trench to an oxide etching agent in an isotropic manner. Depending on the fabrication process employed, the amount of pull back ranges from 30 Å to 200 Å. In FIG. 3D, a thermal oxidation step proceeds to form a liner oxide layer 76 on the exposed silicon substrate 60 surface. A typical thickness for the liner oxide ranges from 300 Å to 600 Å. The structure shown in FIG. 3E is formed by depositing a thick layer of silicon oxide material (not shown) on top of the second nitride layer 68, for example, by LPCVD using tetraethylorthosilicate (TEOS) as a source gas, filling up the trench 80 with the oxide material. After this, a densification process is conducted on the trench filling oxide followed by a chemical mechanical polishing (CMP) step that polishes off the layer of oxide material, leaving the oxide material in the trench 80 substantially planarized with the second silicon nitride layer 68. In FIG. 3F, the second nitride layer 68 is shown to have been striped, for example by wet etching using an etchant containing a hot phosphoric acid solution, leaving behind a protruding oxide structure 80. With reference to FIG. 3G, an isotropic oxide etch step, such as a buffered oxide etch (BOE) with TEOS, that follows results in exposing the first nitride layer 64 while at the same time narrowing the protruding oxide structure 80. As described in the background art section, a protruding oxide structure with a narrower peak translate into a higher coupling ratio for an EEPROM. FIG. 3H shows the profile of the oxide structure 80 after the first nitride layer 64 has been etched off, exposing the thin pad oxide layer 62. FIG. 3I shows the shallow trench isolation structure in its final form, after the thin pad oxide layer 62 has been etched off, for example, by buffered oxide etch (BOE) in a hydrofluoric acid solution.

Having described the steps of forming the trench structure, the functions of each layer will now be described. Just as in the prior art method, the height of the protruding trench structure 80 is mostly determined by the thickness of the top silicon nitride layer 68. However, unlike the prior art method, the thickness of this top nitride layer 68 is not limited by the thickness of pad oxide 62, which has to be kept thin in order to minimize the effect of the final oxide etch. Using the fabrication method taught by the present invention, this top nitride layer 68 can be made to be as thick as necessary, as long as the underlying oxide layer 66 is thick in relationship to it as well. As a result, the height of the gate conductor can be made to be thicker without having to compromise the thickness of the pad oxide 62.

Another advantage of the multi-layer structure of the present invention arises from the fact the first silicon nitride layer 64 functions as natural etching stop during the isotropic etching step of the second oxide layer 66. The nitride layer 64 allows the oxide etch to proceed with little regard to the thickness of the oxide layer 66. As a result, the oxide etching time could be lengthened to form a more desirable profile for the protruding oxide structure 80. It is very desirable to have a shallow trench isolation structure that has a smaller profile at its peak since such structure allows the formation of an EEPROM that has a more favorable coupling ratio. In the present invention the first silicon nitride layer 64, acting as a natural barrier to oxide etchant, makes the controlled formation of such profile possible. As shown in FIG. 3I, the method of isolation trench formation taught by the present invention provides a wider distance 82 between the peak of the isolation structure and the foot of the isolation structure.

Another feature of the present invention calls for an oxide pullback step after the anisotropic trench etch. The main purpose of this pullback step is to expose the corners (74 in FIG. 3C) of the silicon substrate 60. The formation of liner oxide (76 in FIG. 3D) in the subsequent step not only ensure a better oxide fill, but also it changes the profile of exposed substrate corner (74 in FIG. 3C) into a more recessed and rounded one so that it will not be exposed into the active area of the device, as would be the case in the prior art methods.

In another embodiment of the present invention, the first nitride layer 64 is made to be so thin that it would be pullbacked along with the oxide layers during the oxide pullback step depicted in FIG. 3C. The thickness of the first silicon nitride layer could be in the range of 100 Å to 300 Å for optimum results. The result of this modification to the process is shown in FIG. 4. As a result of the pullback of the first nitride layer, the foot of the isolation structure 88 encroaches 84 further into the active area of the device, reducing the active area from a width denoted by 90 to a width denoted by 86, thereby further improving the coupling ratio of the device.

Although the invention disclosed herein specifies a NONO multi-layer construction methodology, one skilled in the art will quickly recognize that the nitride layers function primarily as a barrier layer to CMP and oxide etch. Therefore, different materials with similar properties to the nitride material could be used as well.

What is claimed is:

1. A method of forming an isolation trench structure in a semiconductor device comprising:

forming a first silicon oxide layer, a first masking barrier layer, a second silicon oxide layer and a second masking barrier layer sequentially on a silicon substrate;

performing anisotropic etching to form trenches in said silicon substrate;

filling said trenches with a silicon oxide material;

removing said second masking barrier layer selectively, leaving said silicon oxide trench filling material intact, thereby forming a protruding oxide structure;

removing said second silicon oxide layer using isotropical etch method, thereby shaping said protruding oxide structure so that it has a peak area that is narrower than its foot area; and removing said first masking barrier layer and said first silicon oxide layer sequentially.

2. The method of claim 1, wherein a subsequent liner oxide layer is formed on the exposed silicon substrate after the anisotropic trench etch step.

3. The method of claim 1, wherein the first and second oxide layers are etched back to expose a corner region of the silicon substrate.

4. The method of claim 1, wherein the thickness of the first masking barrier layer is to be within the range of 100 Å to 500 Å.

5. The method of claim 2, wherein the liner oxide layer is pulled back alongside with the subsequent liner oxide during an oxide pullback step, proceeded by the formation of another liner oxide layer on the exposed silicon substrate.

6. The method of claim 1, wherein after the step of filling the trench with an oxide material, the method further includes:

conducting a densification process on the oxide material; and performing chemical mechanical polishing to remove the oxide material on top of the second masking barrier layer.

7. The method of claim 1, wherein the first silicon oxide layer is formed by thermal oxidation of the silicon substrate.

8. The method of claim 1, wherein the oxide material used to fill in the trench is deposited by LPCVD using TEOS as a source gas.

9. A method of forming an isolation trench structure in a semiconductor device comprising:

forming a first silicon oxide layer, a first, silicon nitride layer, a second oxide layer and a second silicon nitride layer sequentially on a silicon substrate;

performing anisotropic etching to form trenches in said silicon substrate;

filling said trench with a silicon oxide material;

removing said second silicon nitride layer selectively, leaving said silicon oxide trench filling material intact, thereby forming a protruding oxide structure;

removing said second silicon oxide layer using isotropical etch method, thereby shaping said protruding oxide structure so that it has a peak area that is narrower than its foot area; and removing said first silicon nitride layer and said silicon oxide layer sequentially.

10. The method of claim 9, wherein a liner oxide layer is formed on the exposed silicon substrate after the anisotropic trench etch step.

11. The method of claim 9, wherein the first and second oxide layers are etched back to expose a corner region of the silicon substrate.

12. The method of claim 9, wherein a thickness of the first silicon nitride layer is to be within the range of 100 Å to 300 Å.

13. The method of claim 11, wherein a liner oxide layer is formed on the exposed silicon substrate after an oxide pull back step.

14. The method of claim 9, wherein after the step of filling the trench with an oxide material, the method further includes;

conducting a densification process on the oxide material; and performing chemical mechanical polishing to remove the oxide material on top of the second silicon nitride layer.

15. The method of claim 9, wherein the first silicon oxide layer is form by thermal oxidation of the silicon substrate.

16. The method of claim 9, wherein the first and second silicon nitride layer is deposited by low-pressure chemical vapor deposition (LPCVD).

17. The method of claim 9, wherein the oxide material used to fill in the trench is deposited by LPCVD using TEOS as a source gas.

* * * * *